United States Patent
Machlis et al.

(10) Patent No.: US 11,603,968 B1
(45) Date of Patent: *Mar. 14, 2023

(54) SYSTEM AND METHOD FOR DIAGONALLY CUTTABLE LED STRIP AND METHOD OF DIAGONALLY CUTTABLE LED STRIP AND METHOD OF USE

(71) Applicants: Daniel Machlis, Arlington, TX (US); Hao Zheng, Arlington, TX (US)

(72) Inventors: Daniel Machlis, Arlington, TX (US); Hao Zheng, Arlington, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 17/175,204

(22) Filed: Feb. 12, 2021

Related U.S. Application Data

(63) Continuation of application No. 16/893,338, filed on Jun. 4, 2020, now Pat. No. 10,948,141.

(60) Provisional application No. 62/587,024, filed on Nov. 16, 2017.

(51) Int. Cl.
| | | |
|---|---|---|
| *F21S 4/00* | (2016.01) | |
| *F21S 4/24* | (2016.01) | |
| *H05K 1/18* | (2006.01) | |
| *F21Y 115/10* | (2016.01) | |
| *F21Y 103/10* | (2016.01) | |

(52) U.S. Cl.
CPC ............... *F21S 4/24* (2016.01); *H05K 1/189* (2013.01); *F21Y 2103/10* (2016.08); *F21Y 2115/10* (2016.08); *H05K 2201/10106* (2013.01)

(58) Field of Classification Search
CPC ....... F21S 4/20; F21S 4/22; F21S 4/24; F21Y 2103/10; F21Y 2115/10; H05K 1/189; H05K 2201/10106
See application file for complete search history.

(56) References Cited

U.S. PATENT DOCUMENTS

| | | | | |
|---|---|---|---|---|
| 5,193,895 A | * | 3/1993 | Naruke ................. | B60Q 1/323 362/249.01 |
| 2006/0215398 A1 | * | 9/2006 | Farmer ................... | F21S 4/10 362/227 |
| 2014/0247595 A1 | * | 9/2014 | Lind ....................... | F21S 4/20 362/249.04 |
| 2016/0302309 A1 | * | 10/2016 | Griffoni .................. | F21S 4/24 |
| 2017/0059140 A1 | * | 3/2017 | Dubuc ..................... | F21S 4/22 |

\* cited by examiner

*Primary Examiner* — Y M. Quach Lee
(74) *Attorney, Agent, or Firm* — Leavitt Eldredge Law Firm

(57) ABSTRACT

A diagonally cuttable LED strip system comprising of a channel having a bottom and one or more side walls and a lens in which a primary circuit board having one or more LED diodes, one or more resistors, and one or more cutting lines resides therein. The one or more cutting lines include perpendicular and non-perpendicular cutting lines which divide the channel into cuttable increments at one or more angles. An extender is provided which attaches to the end of a channel to allow the cuttable increments of the channel to be extended, shortened, or a combination thereof.

2 Claims, 17 Drawing Sheets

SYSTEM AND METHOD FOR DIAGONALLY CUTTABLE LED STRIP AND METHOD OF DIAGONALLY CUTTABLE LED STRIP AND METHOD OF USE

BACKGROUND

1. Field of the Invention

The present invention relates generally to the field of lighting, and more particularly, the field of LED-based flexible strip lighting.

2. Description of Related Art

There are many kinds of linear lighting apparatuses. Many of the most recent ones consist of light emitting diodes (LEDs) as light sources. LEDs are typically provided in a fixture (typically aluminum) with a diffuser (typically acrylic, polycarbonate, or silicone) to produce a clean line of light. Conventional strip lighting has uses in both coves as accent light and in functional lighting instruments used for task lighting. Moreover, conventional strip lighting incorporates perpendicular cutting points to direct users to cut the strip lighting in the desired length.

One limitation that exists in strip lighting is its inability to turn x-axis corners. There are currently some solutions on the market to this challenge, including flexible strip lighting that has some kind of design that allows for bending. However, these designs are imperfect due to the geometry of the printed circuit board (PCB), leading to tape light that has parts raised off the surface of the fixture in order to make the turn. In FIG. 1, a top view of a conventional LED strip designed to make x-axis turns is shown. The LED strip 101 includes an elongated body 103 configured to hold a plurality of LED 105 thereon. A curved section 107 is positioned at a distance from each opposing end of the elongated body 103.

Another option would be to use a plastic-based quick connector, which is limited in that it can create a dark spot in addition to not being able to fit inside many fixtures. One final option would be to have jumper wires soldered onto the tape light which still has the limitation of potentially creating a dark spot.

Accordingly, although great strides have been made in the area of LED based strip lighting, many shortcomings remain.

DESCRIPTION OF THE DRAWINGS

The novel features believed characteristic of the embodiments of the present application are set forth in the appended claims. However, the embodiments themselves, as well as a preferred mode of use, and further objectives and advantages thereof, will best be understood by reference to the following detailed description when read in conjunction with the accompanying drawings, wherein:

Figure 1:
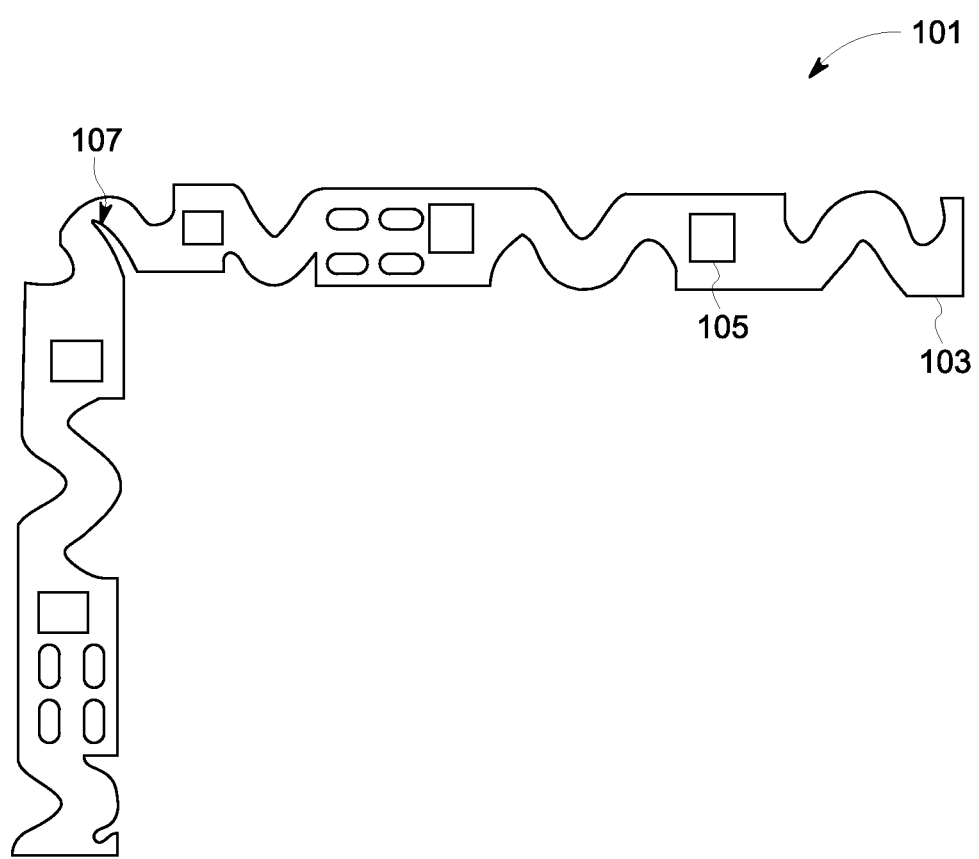
FIG. 1 is an end view of a prior art curved LED apparatus.

While the system and method of use of the present application is susceptible to various modifications and alternative forms, specific embodiments thereof have been shown by way of example in the drawings and are herein described in detail. It should be understood, however, that the description herein of specific embodiments is not intended to limit the invention to the particular embodiment disclosed, but on the contrary, the intention is to cover all modifications, equivalents, and alternatives falling within the spirit and scope of the present application as defined by the appended claims.

DETAILED DESCRIPTION OF THE PREFERRED EMBODIMENT

Illustrative embodiments of the system and method of use of the present application are provided below. It will of course be appreciated that in the development of any actual embodiment, numerous implementation-specific decisions will be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The system and method of use in accordance with the present application overcomes one or more of the above-discussed problems commonly associated with conventional LED strips. Specifically, the system of the present invention provides for an LED strip having cuttable points to create one or more turns at one or more angle degrees. These and other unique features of the system and method of use are discussed below and illustrated in the accompanying drawings.

The system and method of use will be understood, both as to its structure and operation, from the accompanying drawings, taken in conjunction with the accompanying description. Several embodiments of the system are presented herein. It should be understood that various components, parts, and features of the different embodiments may be combined together and/or interchanged with one another, all of which are within the scope of the present application, even though not all variations and particular embodiments are shown in the drawings. It should also be understood that the mixing and matching of features, elements, and/or functions between various embodiments is expressly contemplated herein so that one of ordinary skill in the art would appreciate from this disclosure that the features, elements, and/or functions of one embodiment may be incorporated into another embodiment as appropriate, unless described otherwise.

The preferred embodiment herein described is not intended to be exhaustive or to limit the invention to the precise form disclosed. It is chosen and described to explain the principles of the invention and its application and practical use to enable others skilled in the art to follow its teachings.

Figure 2:
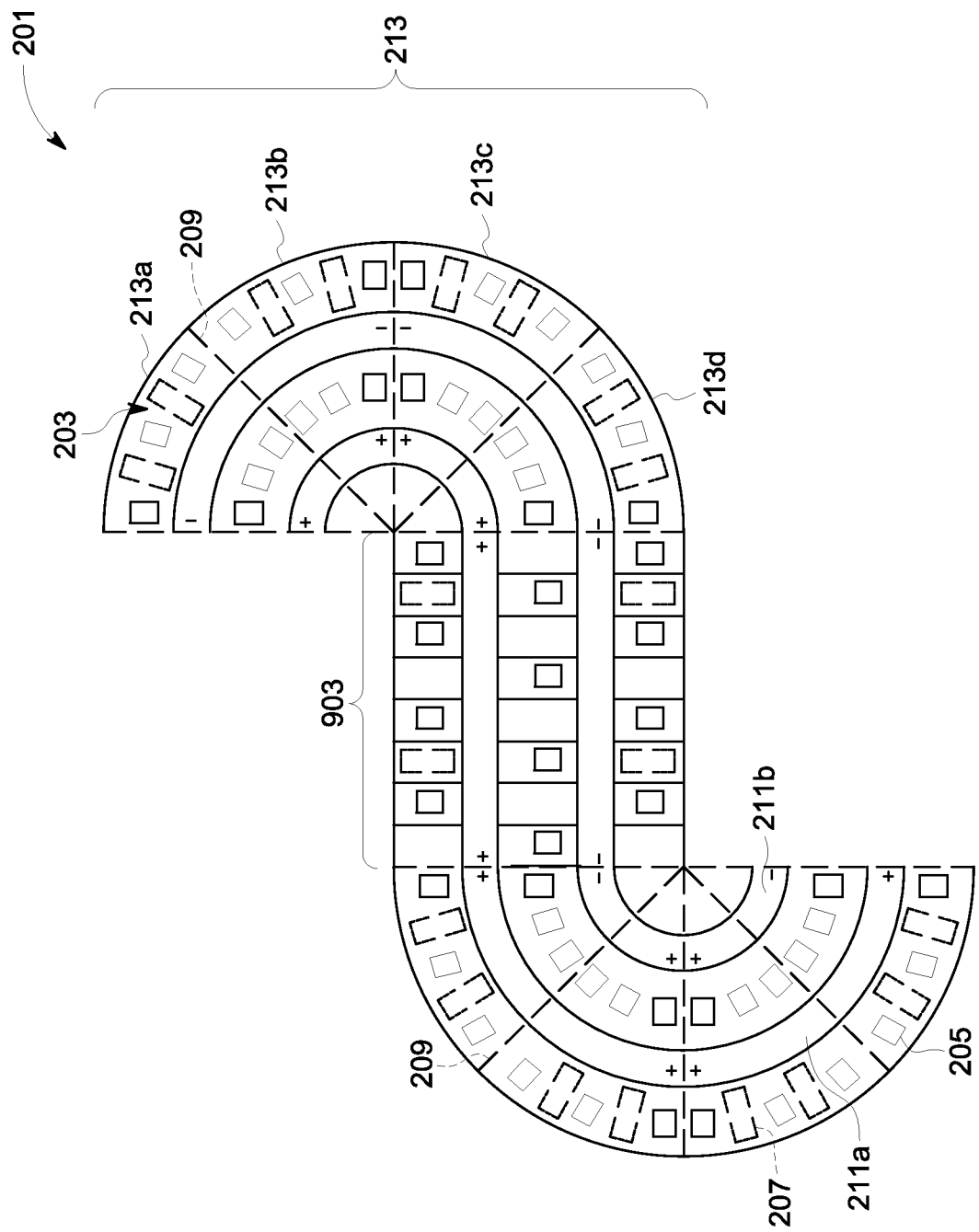
FIG. 2 is a top view of a diagonally cuttable LED strip system in accordance with a preferred embodiment of the present application, illustrating a template of a printed circuit board shaped with a rounded format to allow for obtuse corners.
Figure 3:
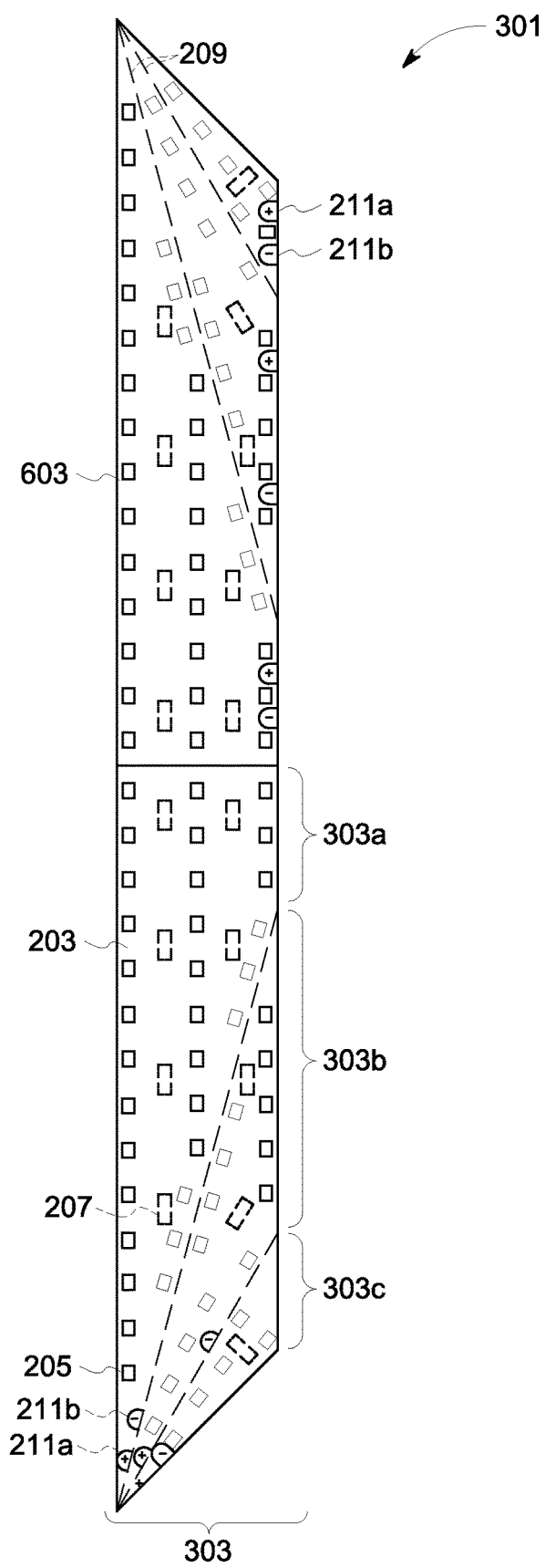
FIG. 3 is a top view of a diagonally cuttable flexible LED strip system in accordance with a preferred embodiment of the present application, illustrating a template of a printed circuit board shaped with an acute angle.

Referring now to the drawings wherein like reference characters identify corresponding or similar elements throughout the several views, FIGS. 2 and 3 depict a top view of a diagonally curved LED strip system 201, illustrating templates of printed circuit boards shaped with a round angle and with an acute angle, respectfully, in accordance with a preferred embodiment of the present application. It will be appreciated that system 201 overcomes one or more of the above-listed problems commonly associated with conventional LED strips.

In the contemplated embodiment, system 201 includes a flexible primary circuit board (PCB) 203 having one or more LEDs 205, one or more resistors 207, one or more designated cutting lines 209, and two or more soldering points 211 which extend throughout the length of the flexible PCB 203 to connect to an anode, for instance 211a, and a cathode, for instance 211b. System 201 may also include an extender 903 (discussed further in FIG. 9) to extend the length of the flexible PCB 203 via the anode 211a and cathode 211b soldering points.

It should be appreciated that the ends of the flexible PCB 203 of FIG. 2 are shaped with obtuse angles to ensure proper positive and negative circuit connection to a straight flexible PCB (not shown) at the anode 211a and cathode 211b soldering points.

It should also be appreciated that the ends of the flexible PCB 203 of FIG. 3 are shaped in acute angles to ensure proper positive and negative circuit connection to a straight flexible PCB (not shown) at the anode 211a and cathode 211b soldering points.

The designated one or more designated cutting lines 209 overlap with the anode 211a and cathode 211b soldering points. It should be appreciated that the designated one or more designated cutting lines 209 may be measured at 1 degree through 359 degrees. The angle of the designated one or more cutting lines 209 includes perpendicular angles, non-perpendicular angles, acute angles, obtuse angles, and straight angles. For example, the shape of an angle can be measured at 15 degrees, 30 degrees, 45 degrees, 90 degrees, or 135 degrees.

In one embodiment, a user may cut the flexible PCB 203 along the one or more designated cutting lines 209 into two or more sections 213 and 303, for instance sections 213a-213d and 303a-303c. The two or more sections 213 and 303 may be coupled with another flexible PCB (not shown) having a straight angle end via the anode 211a and cathode 211b soldering points.

In an alternative embodiment, a user may cut along the one or more designated lines 209 of a flexible PCB 203 to couple to the end of another flexible PCB (not shown) with varying one or more designated cutting lines 209 via the anode 211a and cathode 211b soldering points to create the shape of an angle that can be measured at 1 degree through 359 degrees. The shape of the angle includes perpendicular angles, non-perpendicular angels, acute angles, obtuse angles, and straight angles. For example, the shape of an angle can be measured at 15 degrees, 30 degrees, 45 degrees, 90 degrees, or 135 degrees.

In another embodiment, a user may use the flexible PCB 203 as a standalone without the need to cut along the one or more designated cutting lines 209. For example, a user may directly place the flexible PCB 203 on a desired surface without the need to change the angle and/or length of the flexible PCB 203.

In an alternative embodiment, a user may use the flexible PCB 203 as a standalone with the need to cut along the one or more designated cutting lines 209 to achieve the target angle and/or length of the flexible PCB 203. For example, a user may cut along a designated cutting line measured with a 30 degree angle on the flexible PCB 203 so that the end of the flexible PCB 203 has an angle measured at 30 degrees. The user may then place the flexible PCB 203 on a desired surface that compliments the 30 degree angle.

In another embodiment, a user may use the flexible PCB 203 as a standalone with the need to cut along the one or more designated lines 209 to join another flexible PCB (not shown), or a combination thereof. For example, a user may cut two pieces of flexible PCB along a designated cutting line measured with a 45 degree angle and then couple both pieces of flexible PCB along their respected cut lines via anode and cathode soldering points to create a 90 degree x-axis turn.

It should be appreciated that one of the unique features believed characteristic of the present application is the use of the designated cutting lines in connection with the selective placement of each section of the diagonally cut LED strip. The designated cutting lines allow the diagonally cut LED strip to be conductively coupled despite the orientation (e.g., 15 degrees, 30 degrees, 45 degrees, 90 degrees, 135 degrees, etc.) of each section of the diagonally cuttable LED strip relative to each other.

Referring now to FIGS. 4A through 7C, examples of diagonally cuttable LED strip systems shaped with various angles are shown. It should be appreciated that an obtuse angle includes any angle greater than 90 degrees but less than 180 degrees. It should also be appreciated that an acute angle includes any angle greater than 0 degrees but less than 90 degrees.

Figure 4A:
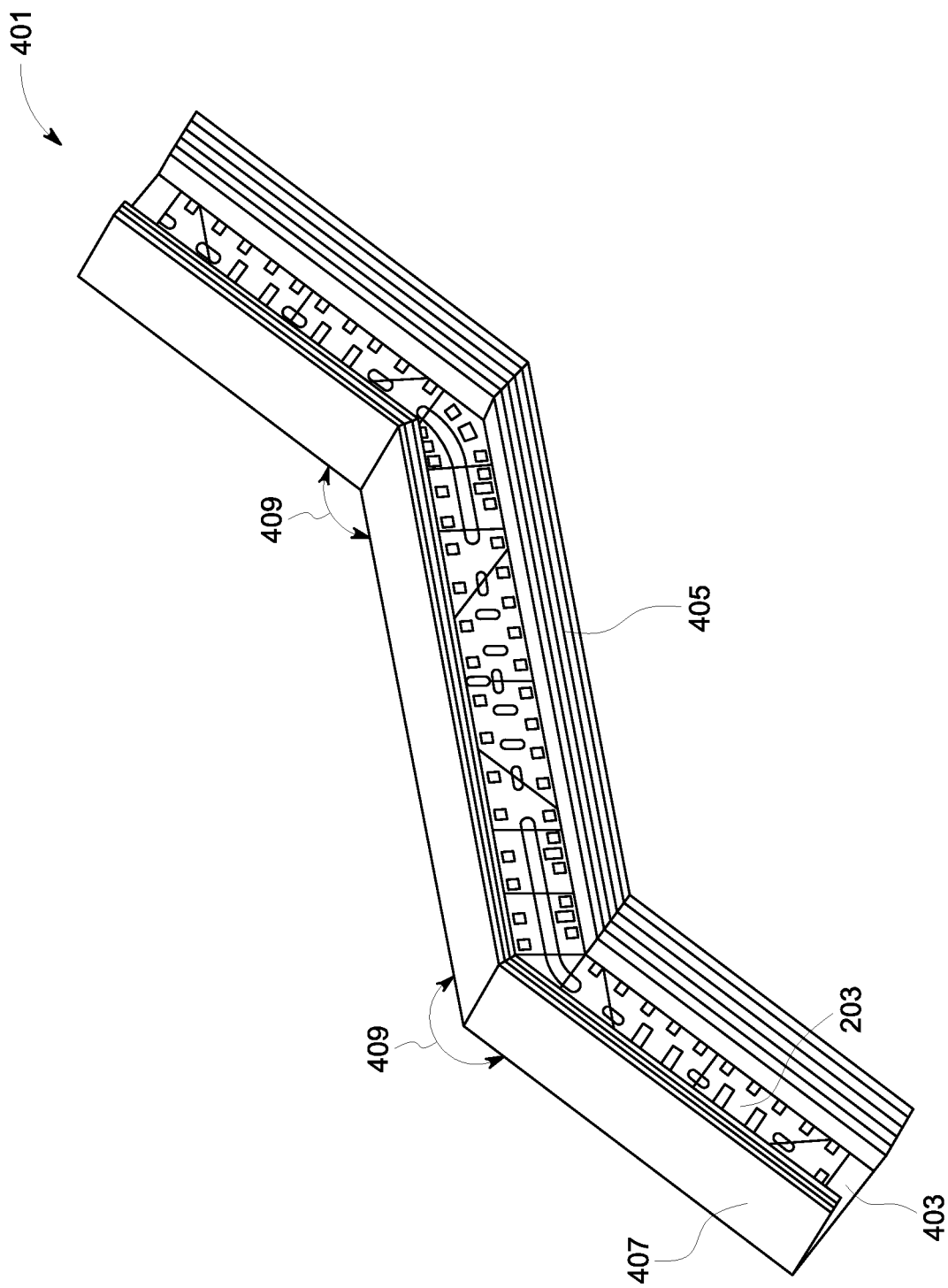
FIG. 4A is an example of a diagonally cuttable flexible LED strip system shaped with an obtuse angle in accordance with an embodiment of the present application.
Figure 4B:
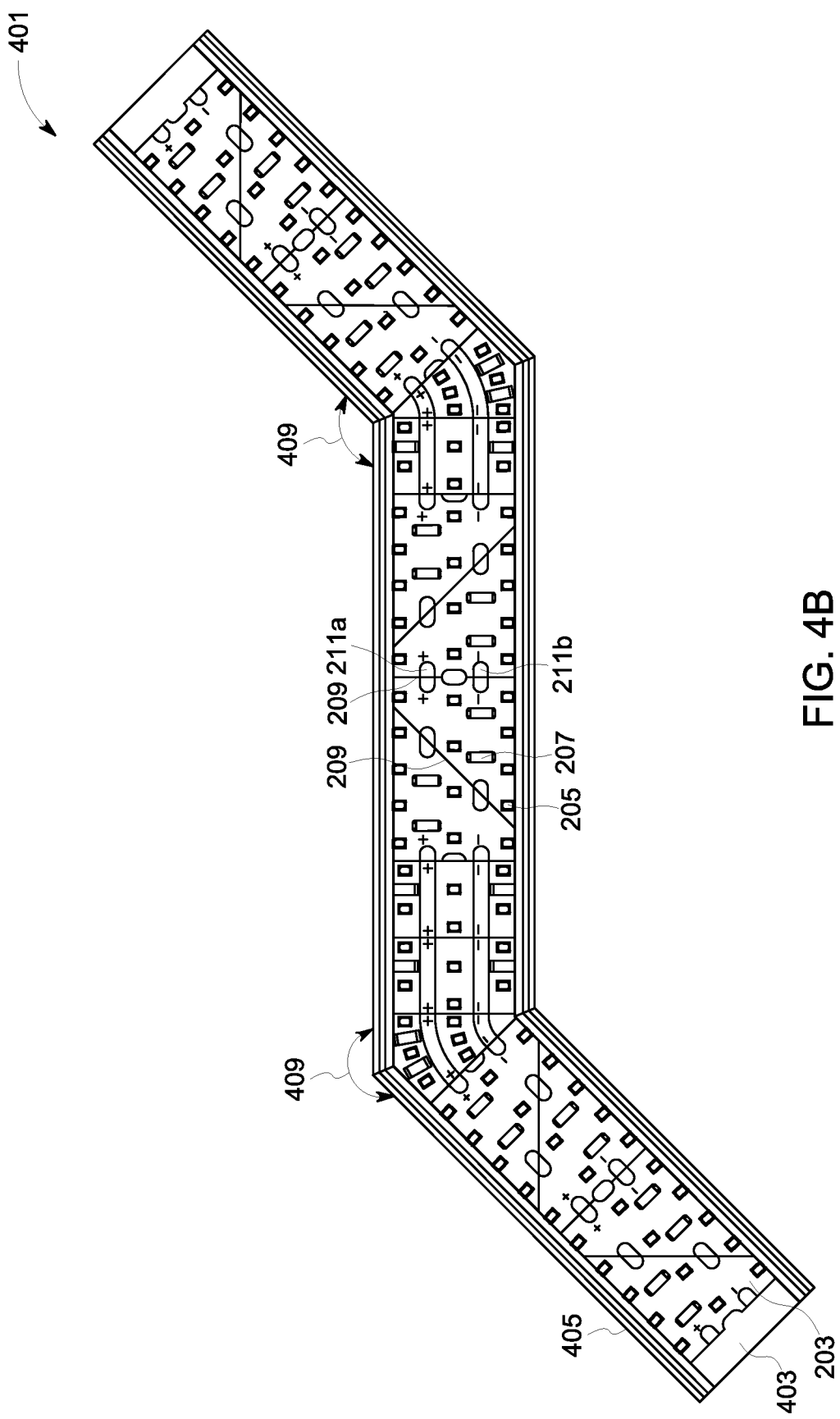
FIG. 4B is a top view of a diagonally cuttable flexible LED strip system of FIG. 4A.
Figure 4C:
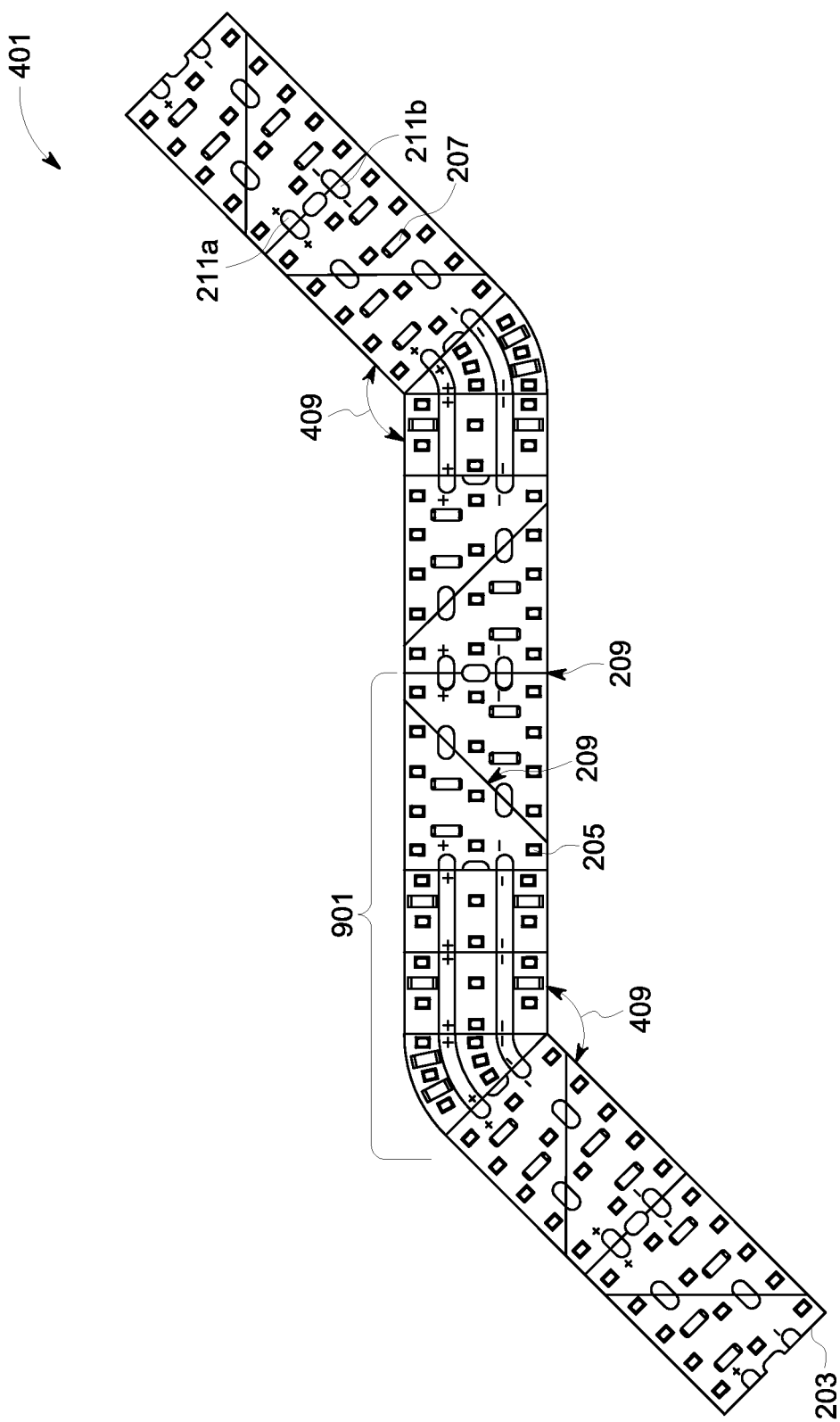
FIG. 4C is a disassembled top view of a diagonally cuttable LED strip system of FIG. 4B.

FIGS. 4A through 4C depict a diagonally cuttable LED strip system 401 shaped with an obtuse angle (e.g., 135 degrees). System 401 includes an elongated channel 403 having one or more sidewalls 405, an elongated lens 407, and the flexible PCB 203 of FIGS. 2 and 3 extending within the elongated channel 403. The elongated channel 405 is flush with flexible PCB 203 as flexible PCB 203 bends at angle 409 (e.g., 135 degrees). System 401 also includes an extender system 801 (discussed further in FIG. 9).

Figure 5A:
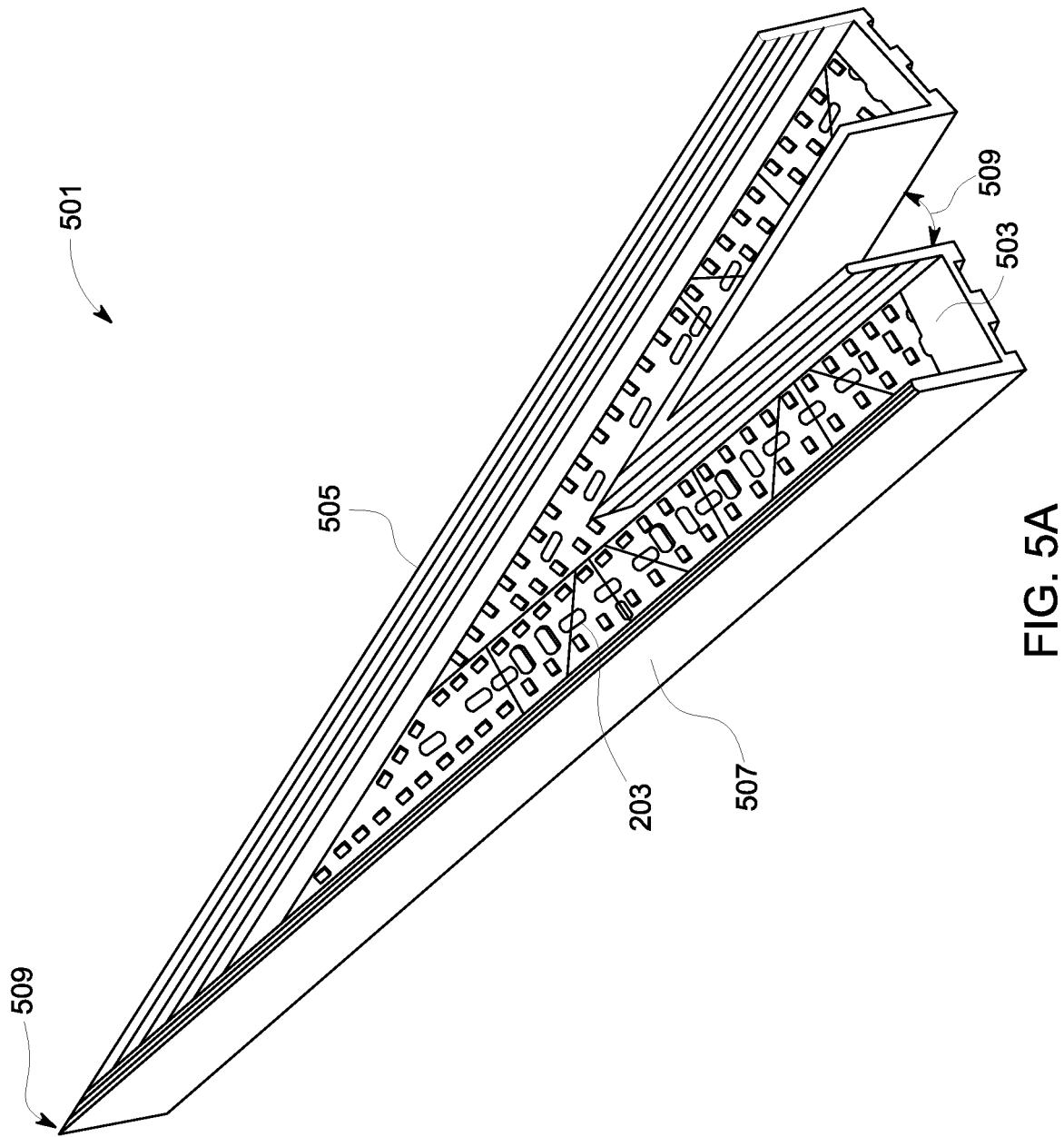
FIG. 5A is an example of a diagonally cuttable LED strip system shaped with another acute angle in accordance with an embodiment of the present application.
Figure 5B:
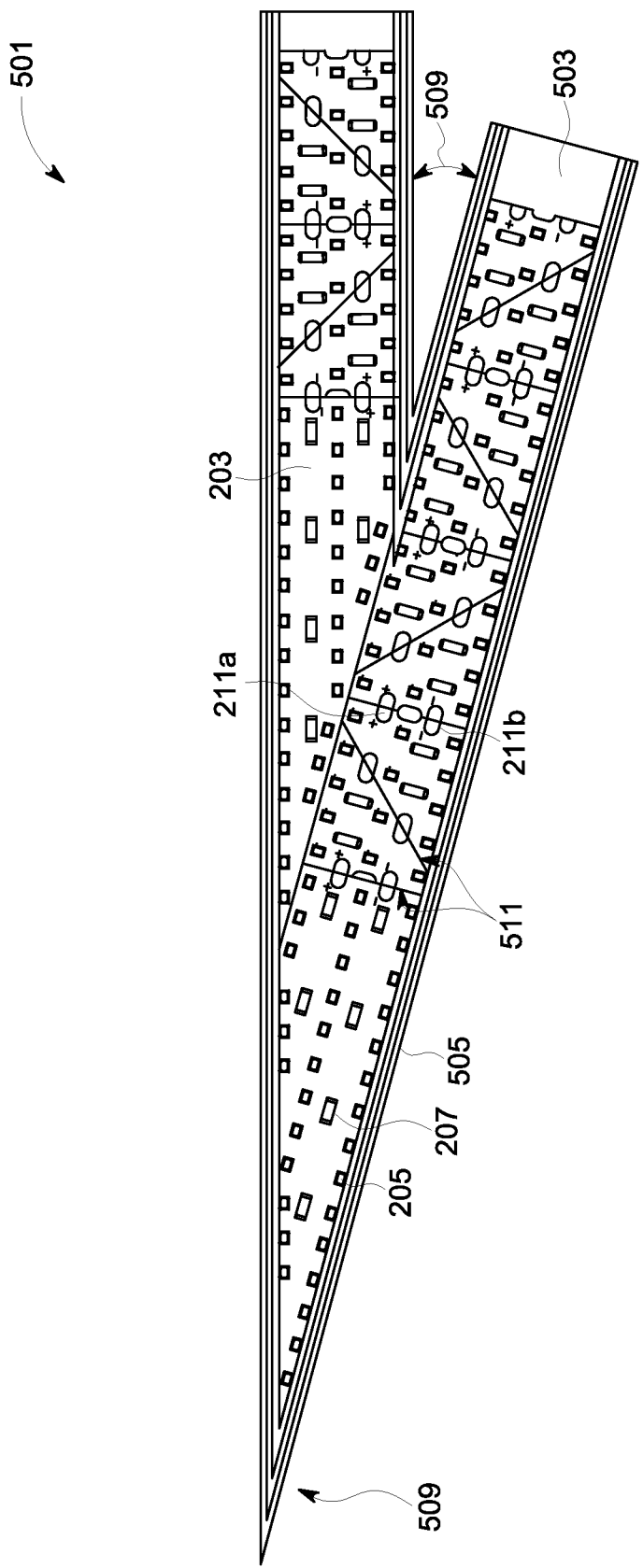
FIG. 5B is a top view of a diagonally cuttable LED strip system of FIG. 5A.
Figure 5C:
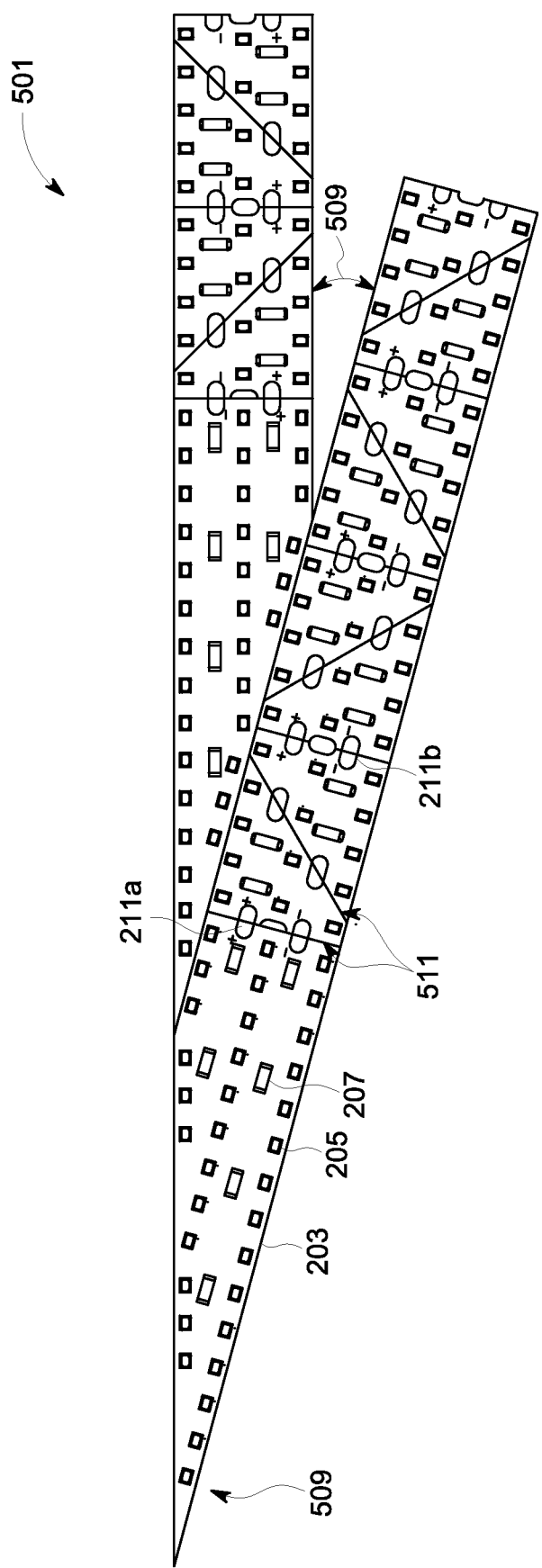
FIG. 5C is a disassembled top view of diagonally cuttable LED strip system of FIG. 5B.

FIGS. 5A through 5C present an example of a diagonally cuttable LED strip system 501 shaped with an acute angle. System 501 includes an elongated channel 503 having one or more sidewalls 505, an elongated lens 507, and the flexible PCB 203 of FIGS. 2 and 3 extending within the elongated channel 503. The elongated channel 505 is flush with flexible PCB 203 as flexible PCB 203 bends at angle 509 (e.g., 15 degrees).

Figure 6A:
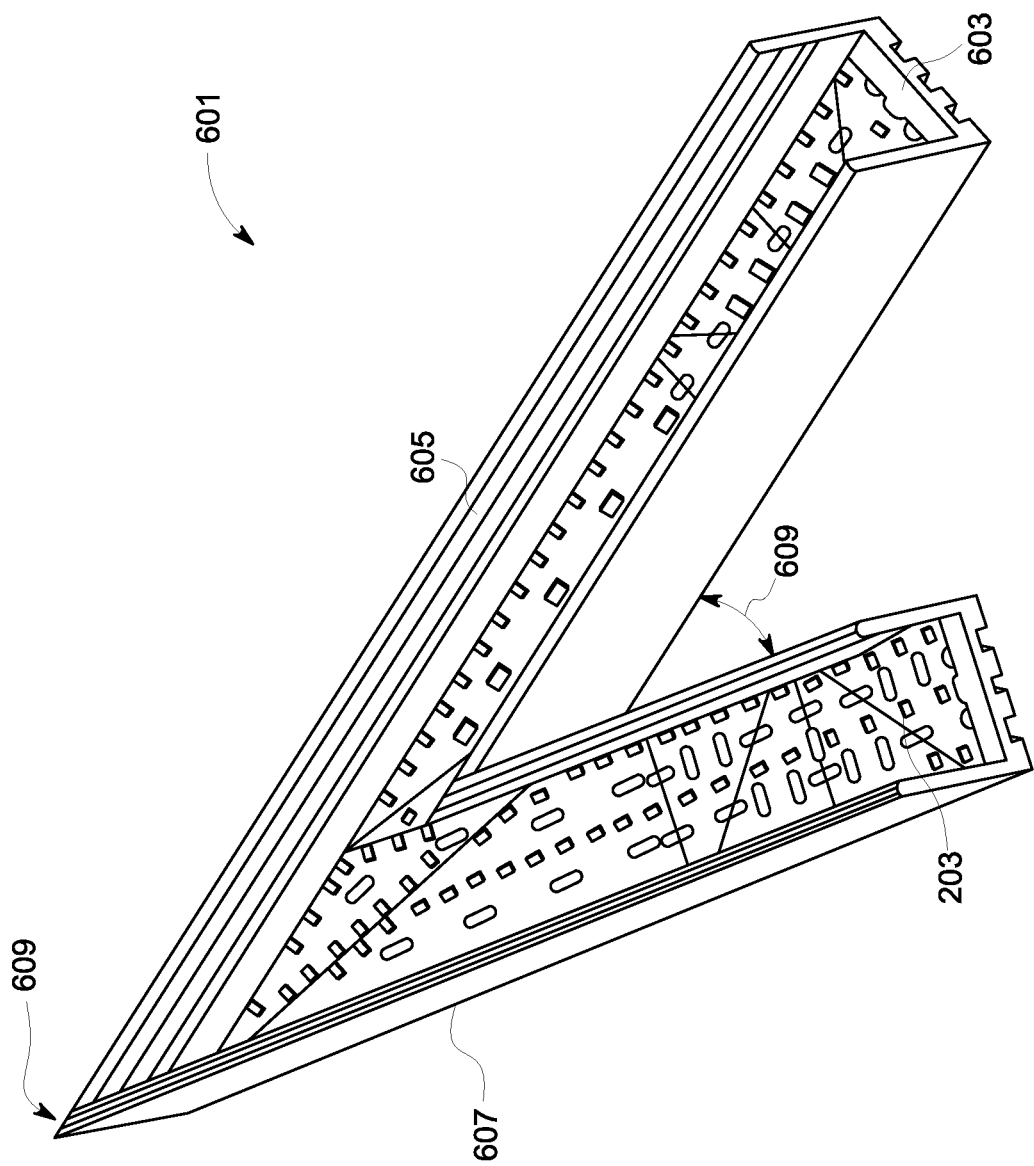
FIG. 6A is an example of a diagonally cuttable LED strip system shaped with another acute angle in accordance with an embodiment of the present application.
Figure 6B:
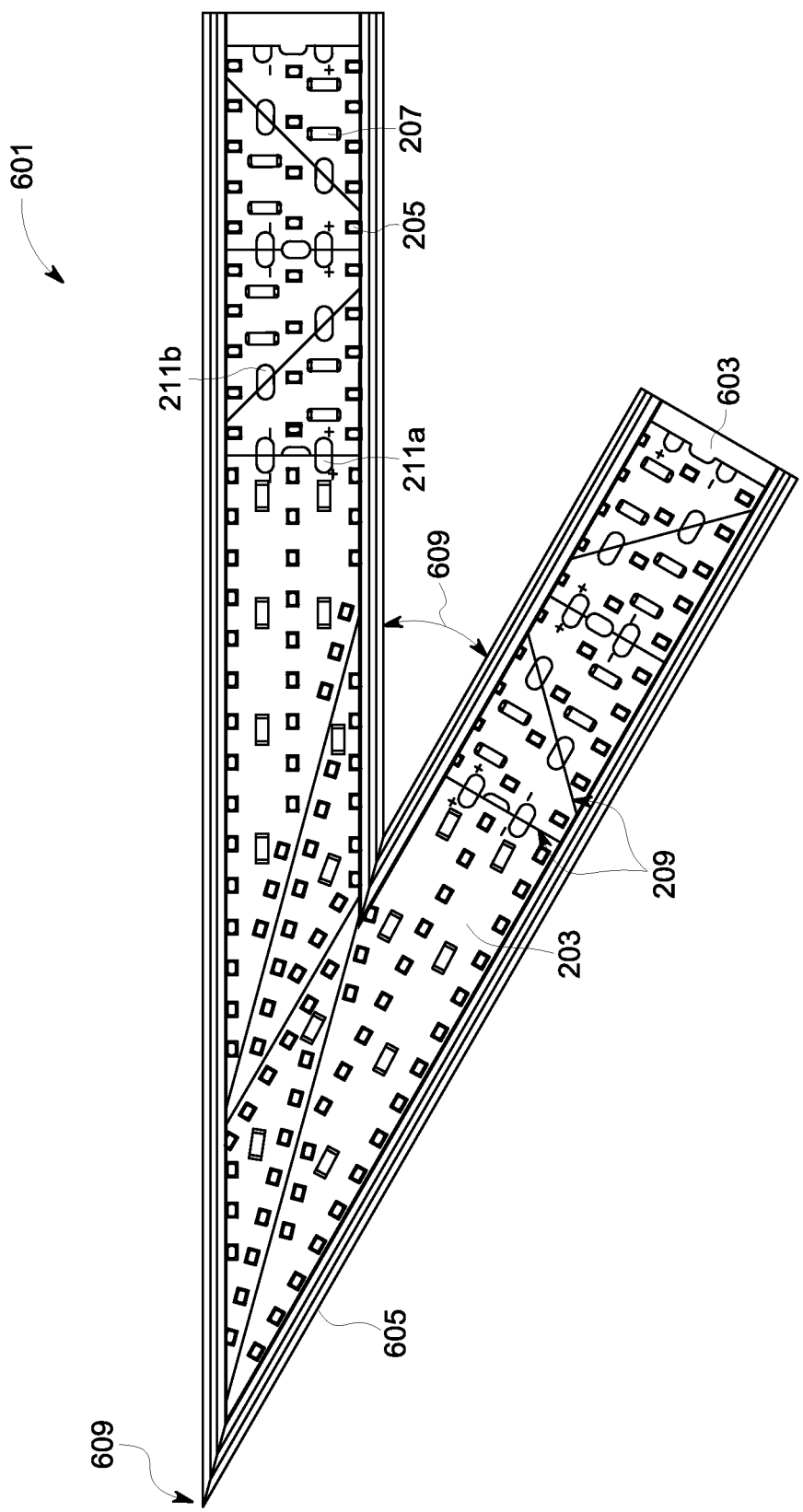
FIG. 6B is a top view of a diagonally cuttable LED strip system of FIG. 6A.
Figure 6C:
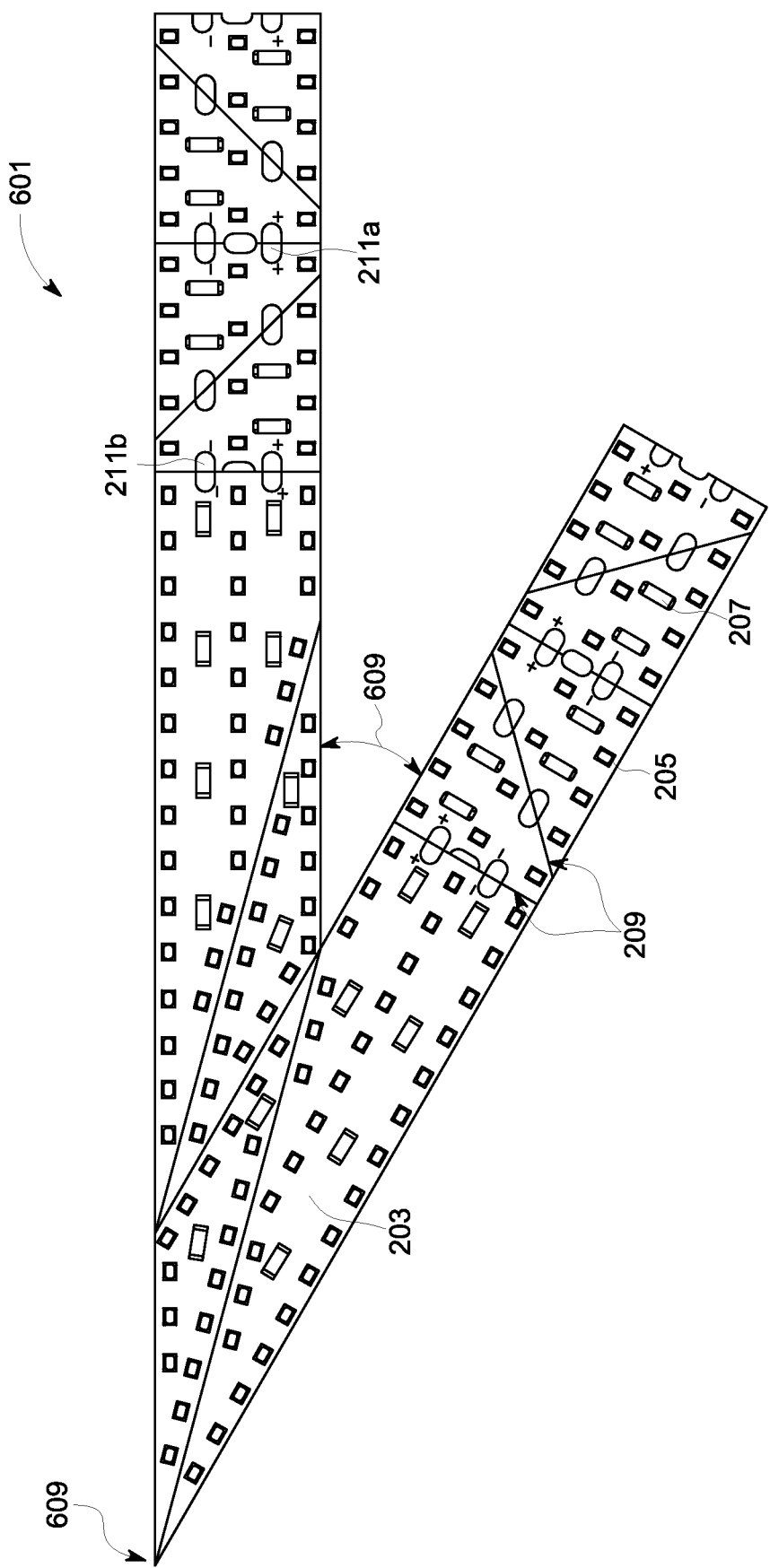
FIG. 6C is a disassembled top view of diagonally cuttable LED strip system of FIG. 6B.

FIGS. 6A through 6C illustrate another example of a diagonally cuttable LED strip system 601 shaped with an acute angle. System 601 includes an elongated channel 603 having one or more sidewalls 605, an elongated lens 607, and the flexible PCB 203 of FIGS. 2 and 3 extending within the elongated channel 603. The elongated channel 605 is flush with flexible PCB 203 as flexible PCB 203 bends at angle 609 (e.g., 30 degrees).

Figure 7A:
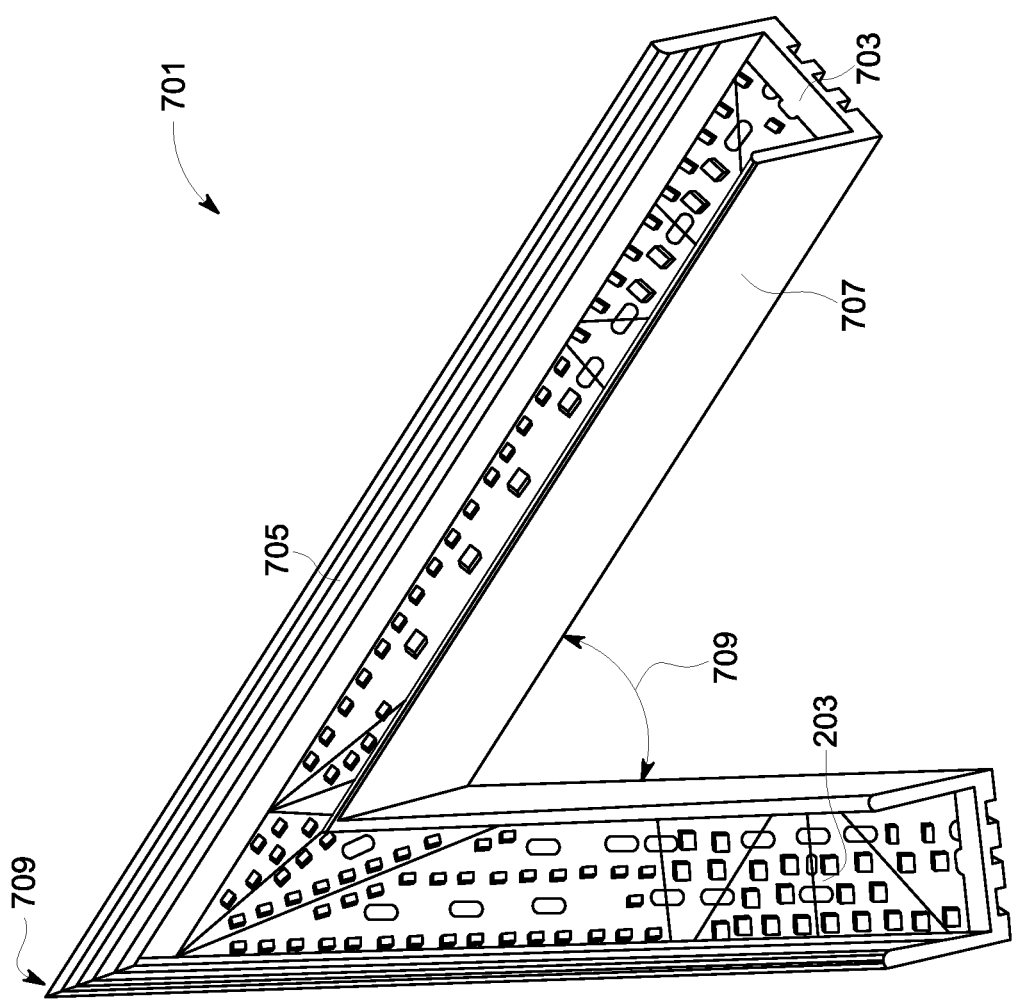
FIG. 7A is an example of a diagonally cuttable LED strip system shaped with another acute angle in accordance with an embodiment of the present application
Figure 7B:
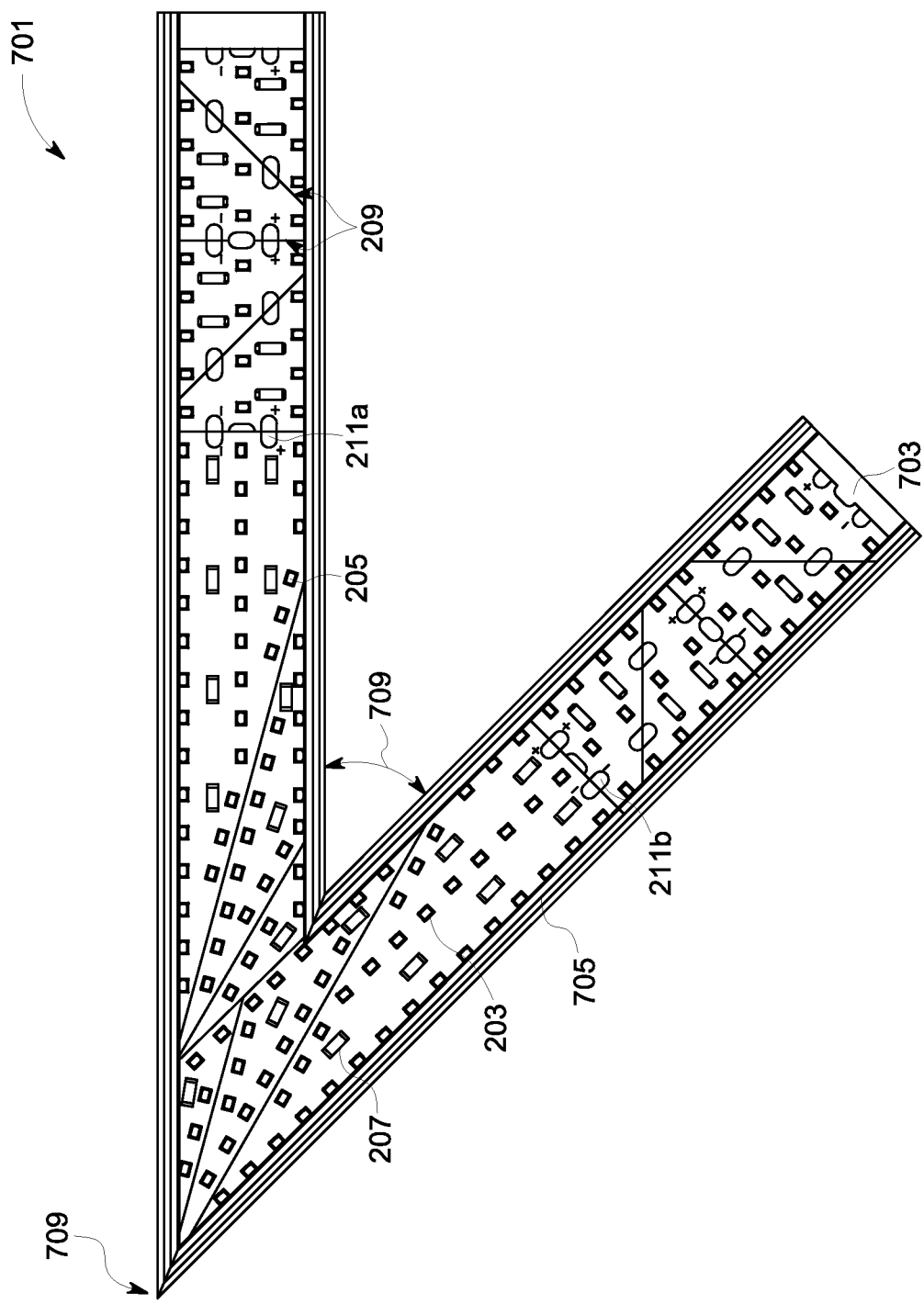
FIG. 7B is a top view of a diagonally cuttable LED strip system of FIG. 7A.
Figure 7C:
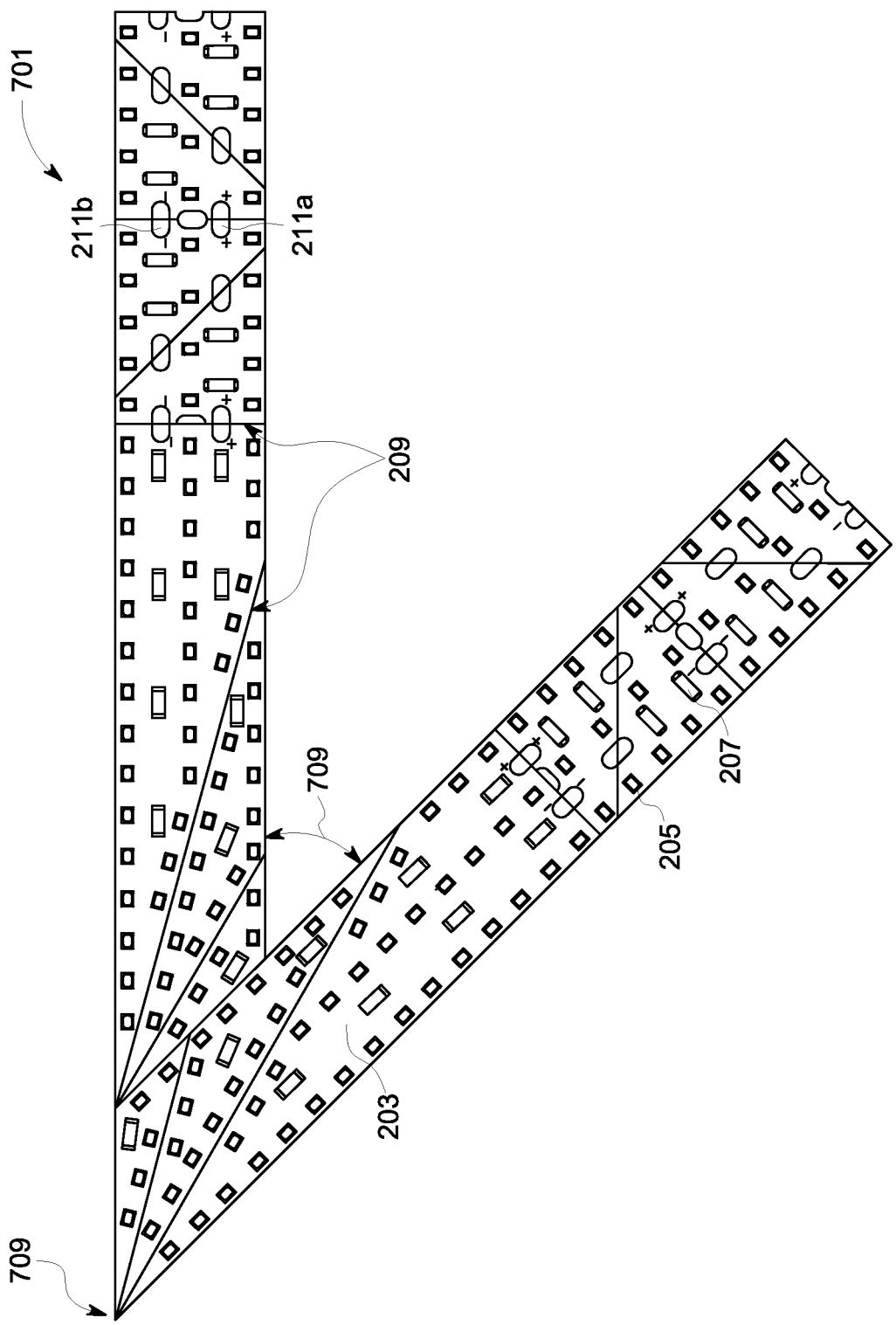
FIG. 7C is a disassembled top view of a diagonally cuttable LED strip system of FIG. 7B.

FIGS. 7A through 7C depict another example of a diagonally cuttable LED strip system 701 shaped with an acute angle. System 701 includes an elongated channel 703 having one or more sidewalls 705, an elongated lens 707, and the flexible PCB 203 of FIGS. 2 and 3 extending within the elongated channel 703. The elongated channel 705 is flush with flexible PCB 203 as flexible PCB 203 bends at angle 709 (e.g., 45 degrees).

Figure 8:
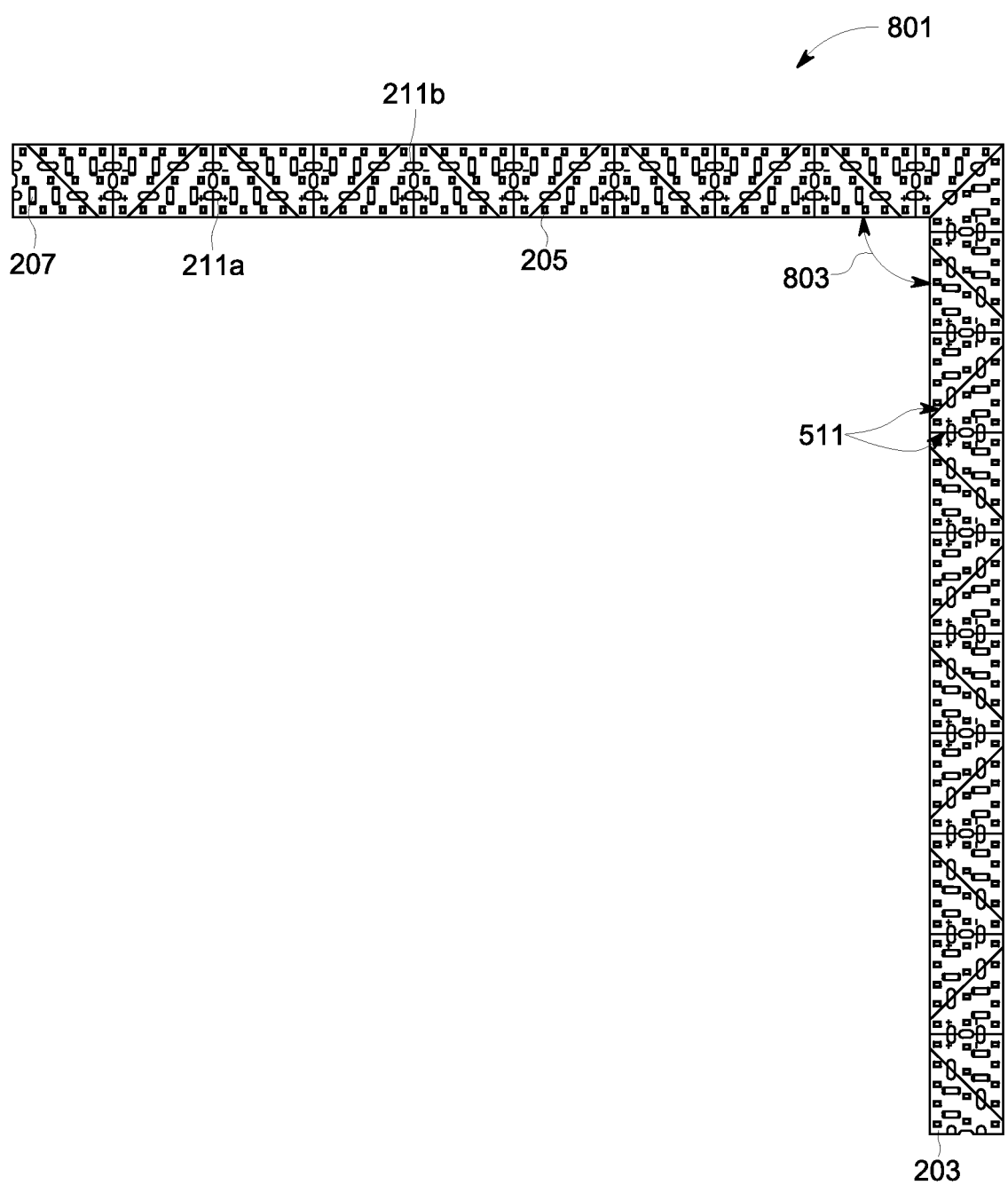
FIG. 8 is a disassembled top view of a diagonally cuttable LED strip shaped with a straight angle in accordance with a preferred embodiment of the present application.

FIG. 8 depicts a disassembled top view of a diagonally cuttable LED strip 801 shaped with a straight angle. System 801 includes the flexible PCB 203 of FIGS. 2 and 3 with having one or more LEDs 205, one or more resistors 207, one or more designated cutting lines 209, and two or more soldering points 211 which extend throughout the length of the flexible PCB 203 to connect to an anode, for instance 211a, and a cathode, for instance 211b.

Figure 9:
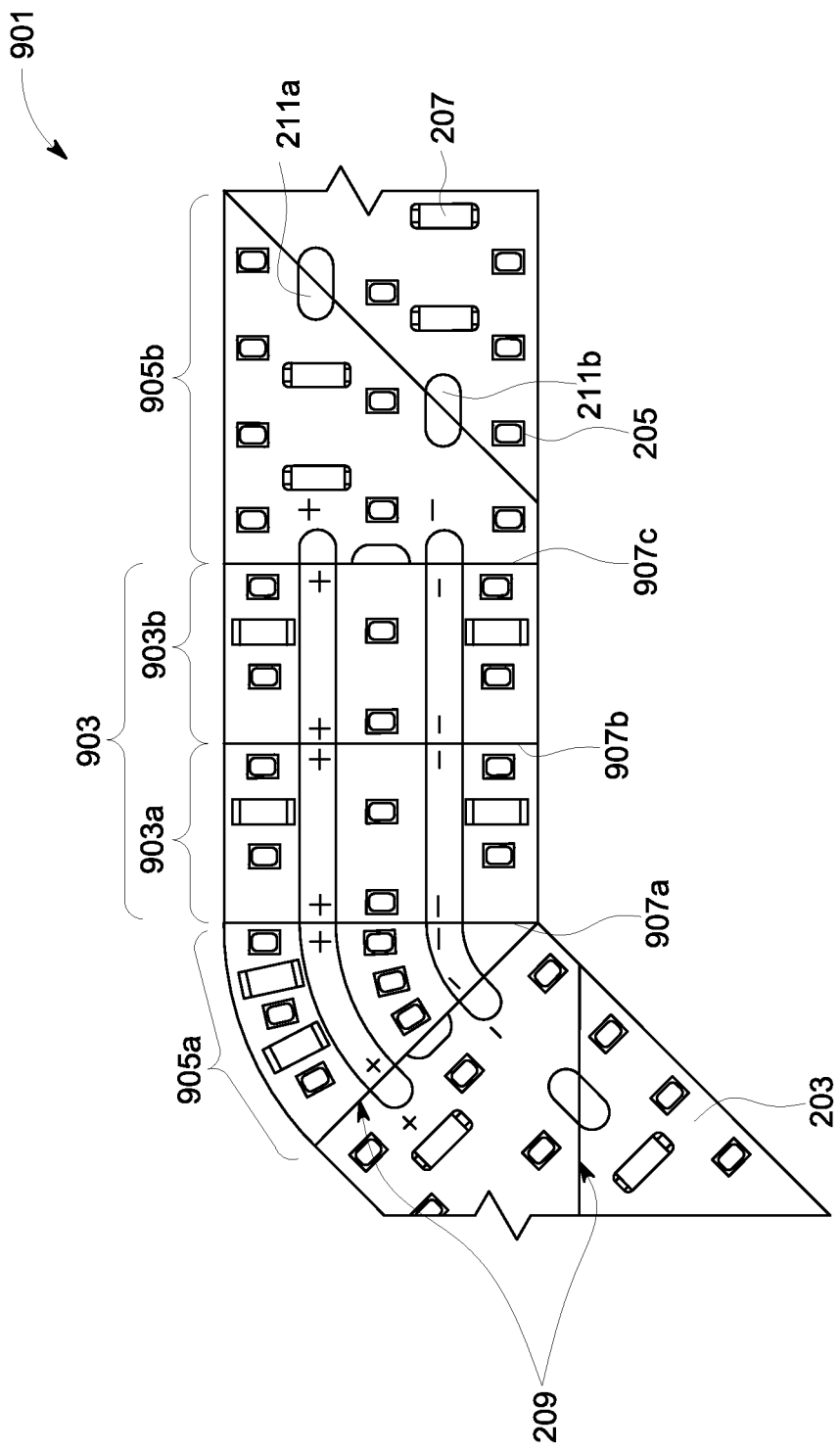
FIG. 9 is a detailed view of a diagonally cuttable LED strip system of FIGS. 4A-4C having an extender in accordance with a preferred embodiment of the present application.

FIG. 9 presents an exploded view of a diagonally cuttable LED strip system 901 of FIGS. 4A-4C having an extender in accordance with a preferred embodiment of the present application. The length of the flexible PCB 203 may be extended via one or more extenders 903 which attach to a section of flexible PCB 203, for instance sections 905a and 905b via the anode and cathode access of soldering points 907a and 907c, respectfully. It should be appreciated that the one or more extenders 903 may comprise of any length (e.g., lengths 903a and 903b) to achieve the target length of a straight or diagonally cuttable LED strip system.

It is contemplated and will be appreciated that the one or more extenders 903 may attach to the end of a flexible PCB 203 having an obtuse angle and/or acute angle via the anode and cathode access soldering points 907a and 907c, respectfully, to the end of another extender via the anode and cathode access soldering points 907b, or a combination thereof.

The particular embodiments disclosed above are illustrative only, as the embodiments may be modified and practiced in different but equivalent manners apparent to those skilled in the art having the benefit of the teachings herein. It is therefore evident that the particular embodiments disclosed above may be altered or modified, and all such variations are considered within the scope and spirit of the application. Accordingly, the protection sought herein is as set forth in the description. Although the present embodiments are shown above, they are not limited to just these embodiments, but are amenable to various changes and modifications without departing from the spirit thereof.

What is claimed is:

1. A diagonally cuttable light emitting diode (LED) strip system, comprising:
   an elongated channel having a bottom portion and one or more walls extending therefrom;
   an elongated lens configured to secure over a top of the elongated channel; and
   a flexible printed circuit board, the flexible printed circuit board having:
      one or more LED lights; and
      one or more extenders;
      wherein the one or more extenders are configured to attach to an end of a flexible printed circuit board via a soldering point;
      wherein the flexible printed circuit board extends within the elongated channel and wherein the one or more LED lights emit light through the elongated lens.

2. The diagonally cuttable LED strip system of claim 1, wherein the one or more LED lights are positioned parallel to the elongated lens.

* * * * *